United States Patent
Bae et al.

[11] Patent Number: 5,862,064
[45] Date of Patent: Jan. 19, 1999

[54] MEDIAN FILTER APPARATUS AND METHOD THEREFOR

[75] Inventors: Moo-Ho Bae; Ju-Hyung Lee, both of Seoul, Rep. of Korea

[73] Assignee: Medison Co., Ltd., Kangwon-Do, Rep. of Korea

[21] Appl. No.: 889,753

[22] Filed: Jul. 8, 1997

[30] Foreign Application Priority Data

Jul. 8, 1996 [KR] Rep. of Korea ................... 27483/1996

[51] Int. Cl.$^6$ .................................................. G06F 17/00
[52] U.S. Cl. ............................... 364/724.014; 364/715.03
[58] Field of Search ....................... 364/715.013, 715.06, 364/724.01, 724.014; 340/146.2

[56] References Cited

U.S. PATENT DOCUMENTS

| | | | |
|---|---|---|---|
| 4,951,242 | 8/1990 | Hobson | 364/724.014 |
| 5,097,433 | 3/1992 | Caracciolo | 364/724.014 |
| 5,138,567 | 8/1992 | Mehrgardt | 364/724.014 |

*Primary Examiner*—Chuong Dinh Ngo
*Attorney, Agent, or Firm*—Dilworth & Barrese

[57] ABSTRACT

A median filter can provide easier implementation and a simplified change of the degree. The median filter comprises an input end, a plurality of median cells for storing one data, wherein each of the median cells is connected to the input end, an upstream median cell and a downstream median cell, and an output end for outputting the output of a median cell which is located in the middle of the plurality of the median cells as a middle value of data stored in the plurality of median cells, wherein the plurality of the median cells perform deleting the earliest data input via the input end among sorted and stored data, iterating an operation for storing in the data-deleted median cell the data stored in the downstream median cell thereof, up to the most downstream median cell, and resorting data received via the input end and the stored data in the manner that each median cell performs, in the case of receiving no data from the upstream median cell, comparing the stored data with the data received via the input end, selecting one of the two data according to the comparison result, outputting the stored data to the downstream median cell, and storing the data received via the input end when the selected data is the data received via the input end, and in the case of receiving data from the upstream median cell, outputting the stored data to the downstream median cell and storing the data applied from the upstream median cell.

11 Claims, 4 Drawing Sheets

FILTER INPUT → MEDIAN FILTERING → FILTER OUTPUT

FILTER INPUT → MEDIAN FILTERING → FILTER OUTPUT

MEDIAN FILTER APPARATUS AND METHOD THEREFOR

BACKGROUND OF THE INVENTION

The present invention relates to a median filter, and more particularly, to a median filter capable of providing easier implementation and a simplified change of the degree.

A median filter is a non-linear filter for outputting a value of a middle size with regard to a predetermined data sequence. Among N+1 data applied to the median filter, a middle value is larger than or equal to N/2 data, or less than or equal to N/2 data, in which N is an even number and represents the degree of the median filter.

Figs. 1A and 1B are views for explaining characteristics of a median filter. FIG. 1A shows an example that a two-dimensional image is filtered using a median filter of 3 by 3. In Fig. 1A, a binary value of "100" is an impulse noise with respect to neighboring values of "1". A pixel value in which impulse noise occurs is replaced by a middle value among the pixel value and neighboring values by using the median filter. Such a median filter effectively removes the impulse noise. A linear filter which averages input values of the linear filter can deteriorate the boundary portion of an image. However, by using a median filter, a boundary characteristic of an image is maintained as shown in Fig. 1B. The median filter having such a characteristic is widely used in image signal processing for television or medical equipment.

The median filter is implemented via methods of using software and hardware. A method of using software uses a predetermined sorting algorithm in a general-purpose microprocessor or digital signal processor (DSP) to sort data sequence and then obtain data having the middle value among the sorted data sequence. However, this method has a drawback that can not process data in a real time since data processing slows down. In order to speed up data processing, studies for implementing a median filter in hardware such as ASIC or FPGA have been developed. The prior art for implementing the median filter in hardware is disclosed in U.S. Pat. No. 5,138,567. FIG. 2 shows a median filter proposed in the prior art, particularly a four-degree median filter. In FIG. 2, four values $I_1$~$I_4$ input in sequence are delayed via delays $22_1$~$22_4$ by a predetermined time. A following input value $I_5$ input to a first delay $22_1$ and adders $21_1$~$21_4$. The adders $21_1$~$21_4$ individually calculate values between the input value $I_5$ and the output values of the delays $22_1$~$22_4$, and the calculated values are stored in shift registers $23_1$~$23_3$, respectively. Values stored in the shift registers $23_1$~$23_3$ are output to a selection unit 24. The selection unit 24 judges magnitudes of the output values from the shift registers $23_1$~$23_3$, and supplies the judged results to a multiplexer 25 as a selection control signal. A multiplexer 25 outputs a middle value OUT among the output values of the delays $22_1$~$22_4$ according to the selection control signal received from the selection unit 24. In the case where a median filter is implemented in hardware, it is advantageous to adopt a small number of gates in view of costs and the degree of integration. However, the selection unit in FIG. 2 is embodied to a comparison logic for comparing a magnitude of the output values from the shift registers. The comparison logic should be re-designed when the degree of the filter is changed, and specially there has difficulty in design since the higher degrees are, the more complicated logic is.

SUMMARY OF THE INVENTION

To solve the above problems, it is an object of the present invention to provide a median filter which provides easier implementation and simplified changes of the degree.

To accomplish the above object of the present invention, there is provided a median filter comprising:

an input end; a plurality of median cells for storing one data, wherein each of the median cells is connected to the input end, an upstream median cell and a downstream median cell; and an output end for outputting the output of a median cell which is located in the middle of the plurality of the median cells as a middle value of data stored in the plurality of median cells, wherein the plurality of the median cells perform deleting the earliest data input via the input end among sorted and stored data, iterating an operation for storing in the data-deleted median cell the data stored in the downstream median cell thereof, up to the most downstream median cell, and resorting data received via the input end and the stored data in the manner that each median cell performs, in the case of receiving no data from the upstream median cell, comparing the stored data with the data received via the input end, selecting one of the two data according to the comparison result, outputting the stored data to the downstream median cell, and storing the data received via the input end when the selected data is the data received via the input end, and in the case of receiving data from the upstream median cell, outputting the stored data to the downstream median cell and storing the data applied from the upstream median cell.

BRIEF DESCRIPTION OF THE DRAWINGS

The preferred embodiment is described with reference to the drawings wherein.

DETAILED DESCRIPTION OF THE PREFERRED EMBODIMENT

Figure 1A:
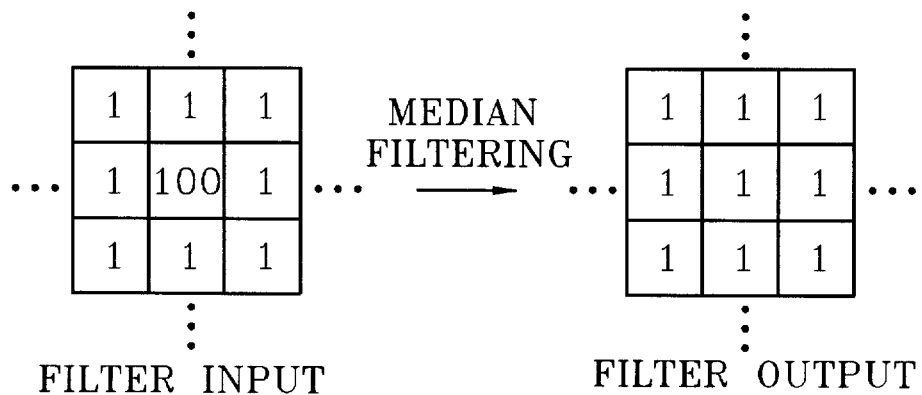
FIGS. 1A and 1B are views for explaining characteristics of a median filter.
Figure 1B:
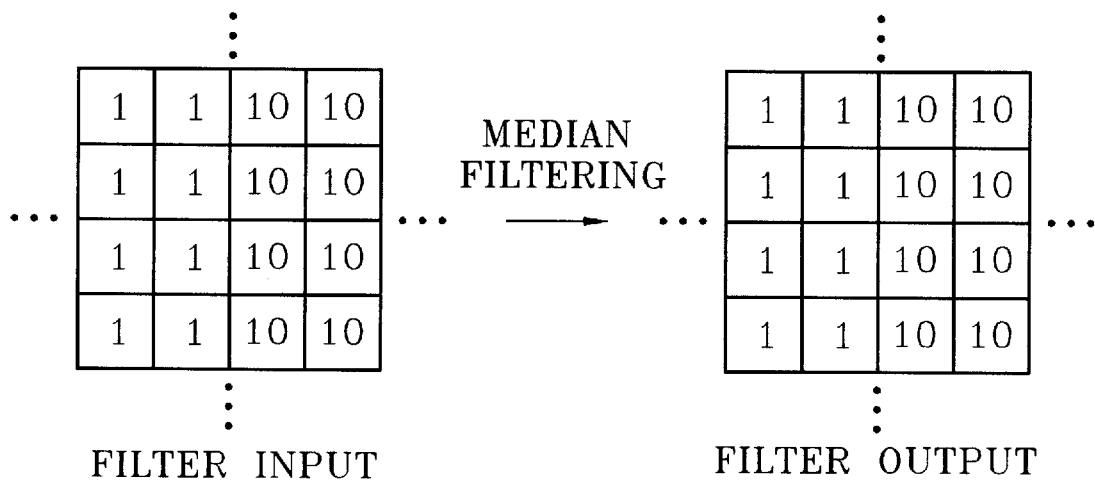
Figure 2:
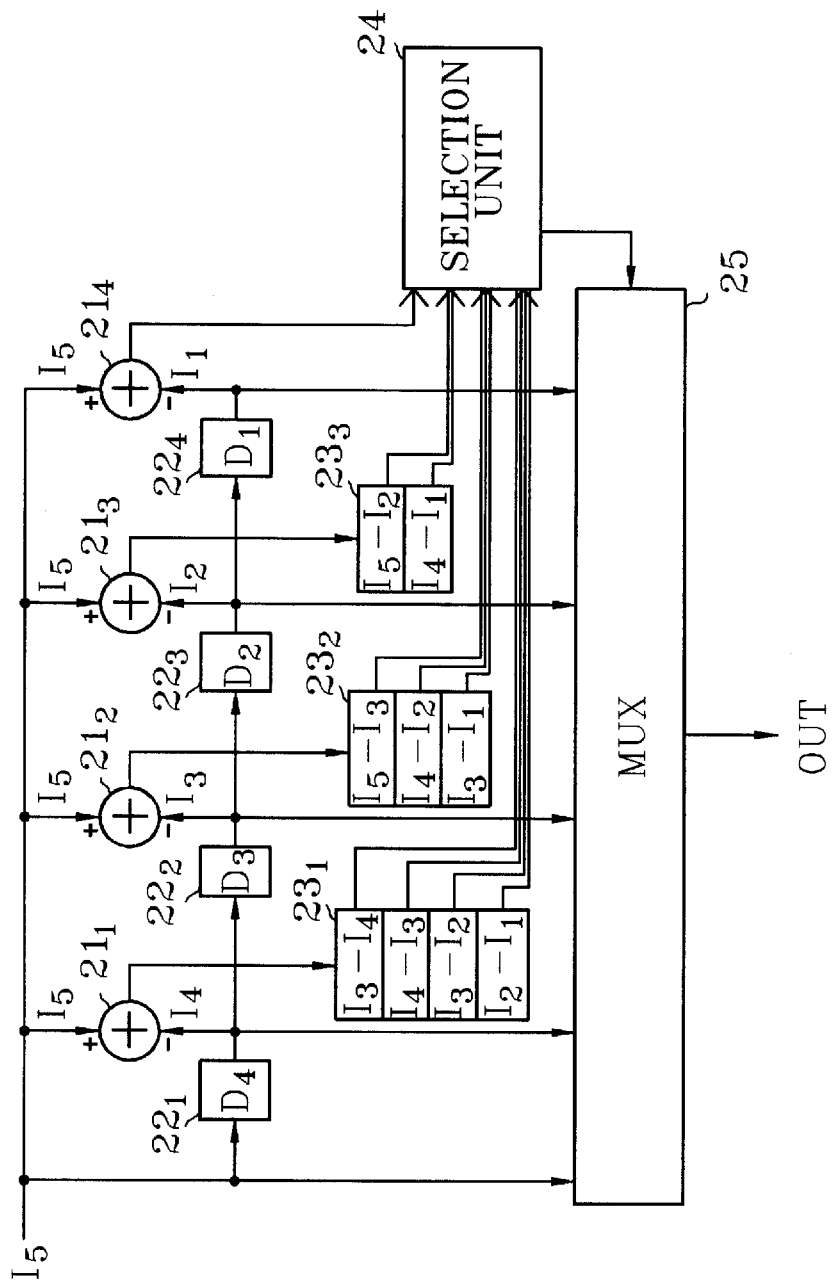
FIG. 2 is a constructional diagram of a median filter according to the conventional art.

A preferred embodiment of the present invention will be described in detail with reference to the accompanying FIG. 3 and FIG. 4.

The present invention employs N+1 median cells for implementing the degree N of a median filter. Referring to FIG. 3, the median filter according to the embodiment of the present invention is a degree 4 of a median filter, which is composed of serially aligned five median cells 31 through 35. The median cells 31 through 35 are connected to an input end 36, respectively, each of which has the same construction. Each median cell 31, 32, 33, 34 or 35 receives data from median cells which are located before and behind its own cell. The median cells 31 through 35 sort, in order of size, five recently input data among data which are successively input via the input end 36 and store the sorted data. When next data is input to the median filter of FIG. 3 via the input end 36, the median cells 31 through 35 resort, in order of size, five recently input data including the newly received data. The resorting is performed in a manner that the median cell 31 and the downstream median cell 32 through 35 store data in a descending order by one and one. Accordingly, the third median cell 33 which is located in the middle of the median cells 31 through 35, outputs a middle value to the external via an output end 37.

Figure 4:
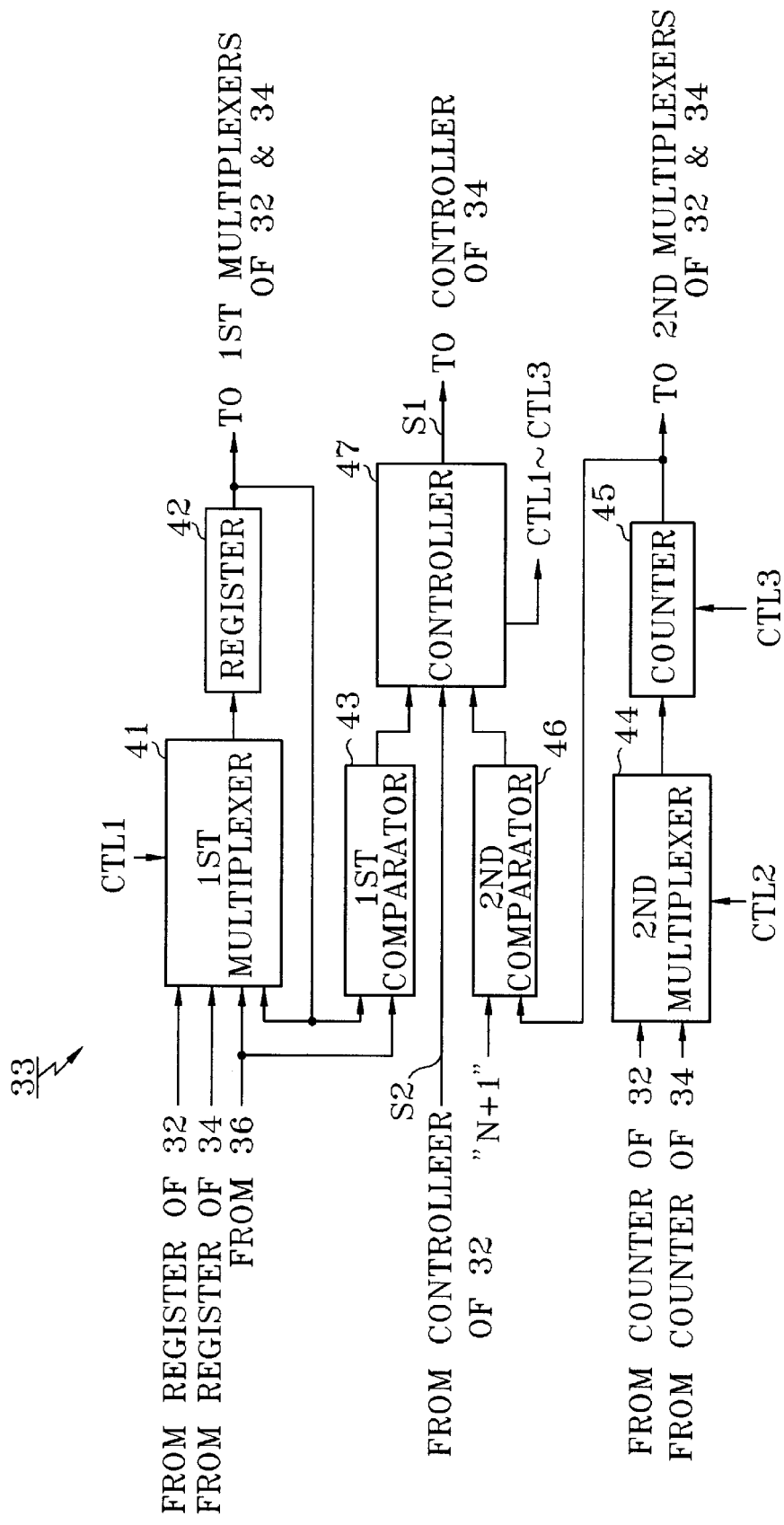
FIG. 4 is a detailed block diagram showing one of medial cells in FIG. 3, particularly a third cell.

After five recently input data are resorted in order of size by the median cells 31 through 35, resorting with regard to data to be newly input via the input unit 36 will be described with reference to FIG. 4 showing a detailed construction of the median cell 33.

In order to use data which is input via the input end 36 for resorting, the input data of the longest duration among data which are previously resorted by the median cells 31 through 35 should be deleted prior to receiving data to be newly input via the input end 36. Deletion of the input data of the longest duration among data stored in the median cells 31 through 35 prior to receipt of a newly input data via the input end 36 will be described as follows.

A counter 45 generates a count value representing the input order of which data stored in the register 42 among five data stored in the median cells 31 through 35 input via the input end 36. A second comparator 46 compares whether a count value output from the counter 45 is equal to a predetermined value of "N+", and supplies a comparison result signal to a controller 47. Here, the predetermined value of N+1 is for judging the input data of the longest duration among data output from each of median cells 31 to 35. Thus, the predetermined value is "5" which is the same as the number of the median cells 31 through 35. Whenever the degree of the median filter is changed, the predetermined value is reset to be suitable to the changed degree by a filter designer.

The controller 47 generates a first control signal CTL1 based on the comparison result signal from the second comparator 46. A first multiplexer 41 which receives data output from registers (not shown) of the median cells 32 and 34, data stored in the register 42 and input data via the input end 36, selects one of the input data according to the first control signal CTL1 and supplies the selected data to the register 42. When the comparison result signal from the second comparator 46 represents that the predetermined value of "N+1" is equal to the output of the counter 45, the controller 47 generates the first control signal CTL1 for selecting data received from the median cell 34 and a first status signal S1 for indicating that data received from the median cell 34 is stored in the register 42. The first multiplexer 41 selects data received from the median cell 34 according to the control signal CTL1 of the controller 47 and supplies the selected data to the register 42. The controller 47 also generates second and third control signals CTL2 and CTL3 so that the counter 45 receives a count value corresponding to data stored in the register 42, that is, a count value corresponding to data received from the median cell 34. At this time, the median cell 34 maintains the data stored in an internal register. Therefore, data stored in the median cell 34 is applied to the first multiplexer 41 of the median cell 33.

Meanwhile, in the case that the comparison result signal of the second comparator 46 represents that the output of the counter 45 is less than the predetermined value of "N+1", the controller 47 is on standby until a second status signal S2 is input from the median cell 32. In the case that the second status signal representing that data output from the median cell 33 is stored in an internal register of the median cell 32 is applied to the median cell 32, the controller 47 of the median cell 33 generates the first control signal CTL1 for storing data supplied from the median cell 34, and the first status signal S1 indicating that data output from the median cell 34 is stored in the register 42. The controller 47 also generates second and third control signals CTL2 and CTL3 so that the counter 45 receives a count value corresponding to data stored in the register 42, that is, a count value corresponding to data received from the median cell 34.

After data of the longest duration is deleted from the median cells 31 through 35 according to the above-described manner, a sorting operation with regard to four data remaining in the median cells 31 to 35 and newly input data via the input end 36 is described as follows.

Figure 3:
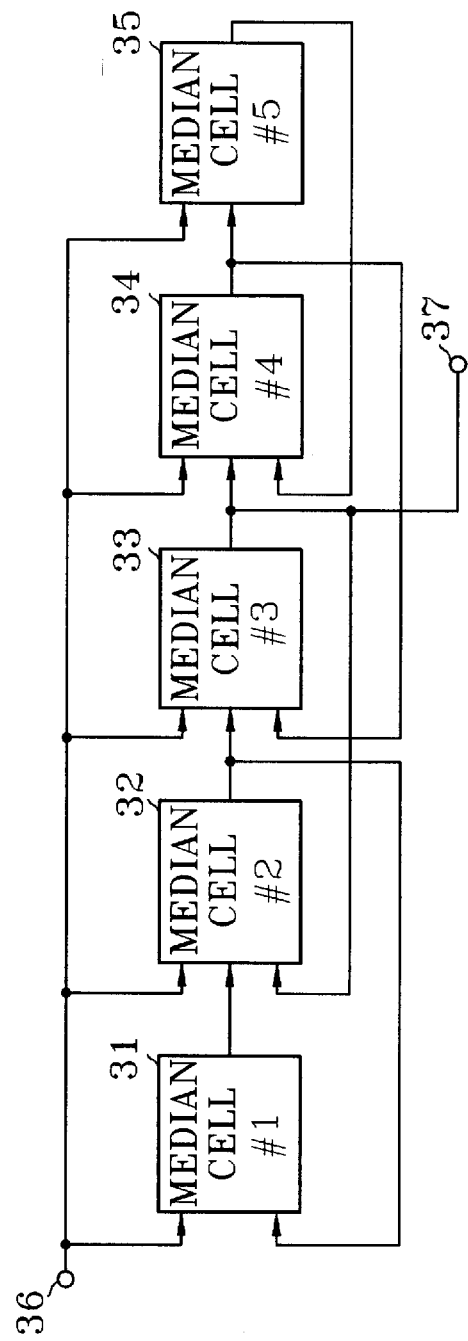
FIG. 3 is a constructional diagram of a median filter according to an embodiment of the present invention.

Data which is newly input to the apparatus of FIG. 3 via the input end 36 is applied to the median cells 31 through 35, respectively. A first comparator 43 of the median cell 33 compares the newly input data with the data stored in the register 42, and outputs the comparison result signal to the controller 47. The controller 47 generates the first status signal SI based on the comparison result signal received from the first comparator 43. In the case that the received comparison result signal represents that the newly input data is less than the data stored in the register 42, the controller 47 generates the first control signal CTL1 to maintain the data itself stored in the register 4, and the third control signal CTL3 to increase by "1" the count value stored in the counter 45. The first multiplexer 41 selects data received from the register 42 according to the first control signal CTL1. The counter 45 increases by "1" the stored count value according to the third control signal CTL3, and the increased count value is input to the second comparator 46.

On the other hand, in the case that the received comparison result signal represents that the newly input data is larger than or equal to the data stored in the register 42, the controller 47 outputs the first status signal S1 for this case to the median cell 34, and judges whether the second status signal S2 received from the median cell 32 represents that the newly input data is larger than or equal to data stored in the median cell 32. In the case that the second status signal S2 indicates that the newly input data is less than the stored data, the controller 47 generates the first control signal CTL1 for storing the data received via the input end 36 in the register 42, and also produces the third control signal CTL3 which resets the counter 45 to an initial value of "1".

Meanwhile, in the case that the comparison result signal of the first comparator 43 represents that the newly input data is larger than or equal to the data stored in the register 42, when the second status signal S2 received from the median cell 32 indicates that the newly input data is larger than or equal to the data stored in the median cell 32, the controller 47 generates the first control signal CTL1 for storing the data received from the median cell 32 in the register 42. Also, the controller 47 generates the second control signal CTL2 for supplying to the counter 45 a count value received from the median cell 32, that is, a count value corresponding to data received from the median cell 32, and generates the third control signal CTL3 which makes the counter 45 increase by "1" the count value received from the second multiplexer 44. Accordingly, the second multiplexer 44 selects a count value received from the median cell 32, and the counter 45 increases by "1" the selected count value input from the second multiplexer 44.

In this manner, data stored in a median cell storing the data input via the input end 36 and median cells which are sequently connected behind that median cell, are moved to the downstream median cells, respectively. As a result, five data are resorted in descending order, and simultaneously data of the median cell 33 is output to the external via an output end 37 as an middle value (median) of resorted data.

Among the resorted data, data having a corresponding count value of "5" is deleted, as described above, before next data is input via the input end 36, and an operation that data input via the input end 36 is inserted into a position maintaining a descending order is iterated as the above.

As described above, the present invention is described to sort data in descending order. However, it is known to those of ordinary skill in the art to obtain a middle value by ascending sorting.

When changing the degree of the median filter according to the present invention, a "the degree +1" number of median cells are coupled in serial and an output end of the middle-positioned median cell is just connected to that of the median filter. Accordingly, the present invention provides advantages that redesign of a logic is not required when the degree of the filter is changed, and that the higher the degree, the better a median cell is implemented.

While only certain embodiments of the invention have been specifically described herein, it will apparent that numerous modifications may be made thereto without departing from the spirit and scope of the invention.

What is claimed is:

1. A median filter comprising:

an input;

a plurality of median cells for storing one data, wherein each of the median cells is connected to said input an upstream median cell and a downstream median cell; and an output connected to a median cell which is located in the middle of said plurality of median cells for outputting a middle value of data stored in said plurality of median cells;

wherein said plurality of the median cells delete the earliest data input among sorted and stored data, initiate an operation for storing in the data-deleted median cell the data stored in the downstream median cell thereof, up the most downstream median cell, and resort data received via said input and the stored data in the manner that each median cell performs, wherein when no data is received from the upstream median cell, said plurality of median cells compare the stored data with the data received via said input, select one of said two data according to the comparison result, outputs the stored data to the downstream medial cell, and stores the data received via said input when the select data is the data received from said input, and wherein when data is received from the upstream median cell, said plurality of median cells output the stored data to the downstream median cell and store the data applied from the upstream median cell.

2. The median cell according to claim 1, wherein each of said plurality of the median cells selects data having a smaller value from the stored data therein and the received data via said input when the most upstream median cell stores the smallest value.

3. The median cell according to claim 1, wherein each of said plurality of median cells selects data having a larger value from the stored data therein and the received data via said input when the most upstream median cell stores the largest value.

4. The median cell according to claim 3, wherein each median cell comprises:

a register;

a multiplexer for selecting one of data received from the input, register, and the upstream and downstream median cells, and supplying the selected data to said register; and control means for controlling said multiplexer according to data received from the input and the register and a status signal applied from the upstream median cell, wherein said control means controls said multiplexer to store the data received from the upstream median cell in said register, when the status signal represents that the upstream median cell stores the data received from the input end, controls said multiplexer to store data having a larger value from the data stored in the register and the data received via the input in said register, when the status signal represents that the upstream median cell does not store data received via the input, and outputs a status signal indicating that data is stored in the register, when the data received via the input has a large value.

5. The median cell according to claim 3, wherein said control means comprises:

a first comparator for comparing the data received from said input with data received from said register, and outputting a comparison result signal;

a multiplexer for selecting one of a count value input from the upstream median cell and a count value input from the downstream median cells, and outputting the selected value;

a counter for counting and outputting one of a count value input from said multiplexer and a count value corresponding to data stored in said register;

a second comparator for comparing a predetermined value with the count value output from said counter, and outputting a second comparison result signal; and a controller responsive to the first and second comparison result signals and the status signal from the upstream median cell, for controlling said multiplexer and said counter, wherein the count value output from said counter represents the duration that data received from said input is stored in said register with respect to the data stored in a plurality of the median cells.

6. The median cell according to claim 5, wherein said predetermined value is equal to the number of said plurality of median cells.

7. The median cell according to claim 5, wherein said controller controls said multiplexers to store the data received from the downstream median cell in said resister, and to apply a corresponding count value to said counter, when said second comparison result signal represents that the data stored in the register is the earliest input data.

8. The median cell according to claim 5, wherein said controller controls said multiplexers to store the data received from the downstream median cell in said resister, and to apply the corresponding count value to said counter, when said status signal represents that the data stored in said register is stored in the upstream median cell.

9. A method of median filtering comprising the steps of:

connecting a plurality of median cells to an input;

connecting each median cell to an upstream median cell and a downstream median cell;

deleting an earliest data input received via said input among sorted and stored data;

storing in the data deleted median cell the data stored in the downstream median cell thereof;

resorting the input data and the stored data in order of size; and outputting a median value among received and sorted data from an output.

10. The method according to claim 9, further comprising the steps of:

comparing the stored data with the data received via said input;

selecting one of the two compared data;

outputting the stored data to the downstream median cell; and storing the data received via said input when the selected data is the data received via said input;

wherein said steps of comparing, selecting, outputting and storing are performed when no data is received from the upstream median cell.

11. The method according to claim 9, further comprising the steps of:

outputting the stored data to the downstream median cell; and storing the data applied from the upstream median cell;

wherein said steps of outputting and storing are performed when data is received from the upstream median cell.

* * * * *